(12) United States Patent
deVilliers

(10) Patent No.: US 10,460,938 B2
(45) Date of Patent: Oct. 29, 2019

(54) METHOD FOR PATTERNING A SUBSTRATE USING A LAYER WITH MULTIPLE MATERIALS

(71) Applicant: Tokyo Electron Limited, Tokyo (JP)

(72) Inventor: Anton J. deVilliers, Clifton Park, NY (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 15/488,117

(22) Filed: Apr. 14, 2017

(65) Prior Publication Data
US 2017/0301552 A1    Oct. 19, 2017

Related U.S. Application Data

(60) Provisional application No. 62/322,603, filed on Apr. 14, 2016.

(51) Int. Cl.
*H01L 21/308* (2006.01)
*H01L 21/311* (2006.01)
*H01L 21/3105* (2006.01)
*H01L 21/033* (2006.01)

(52) U.S. Cl.
CPC .............................. *H01L 21/0337* (2013.01)

(58) Field of Classification Search
CPC ........... H01L 21/3086; H01L 21/31111; H01L 21/31053
See application file for complete search history.

(56) References Cited

U.S. PATENT DOCUMENTS

| 8,273,634 B2 | 9/2012 | Sills et al. |
| 8,486,611 B2 | 7/2013 | Millward et al. |
| 8,575,032 B2 | 11/2013 | Light et al. |
| 8,603,884 B2 | 12/2013 | Sills et al. |

(Continued)

FOREIGN PATENT DOCUMENTS

WO    WO 2010/096363 A2    8/2010

OTHER PUBLICATIONS

S. Wolf and R.N. Tauber, (Silicon Processing for the VLSI Era, vol. 1—Process Technology, Lattice Press, 1986)(pp. 545-547) (Year: 1986).*

(Continued)

*Primary Examiner* — Duy Vu N Deo
*Assistant Examiner* — Mahmoud Dahimene
(74) *Attorney, Agent, or Firm* — Oblon, McClelland, Maier & Neustadt, L.L.P.

(57) ABSTRACT

Techniques disclosed herein provide a method of patterning for creating high-resolution features and also for cutting on pitch of sub-resolution features. Techniques include forming bi-layer or multi-layer mandrels and then forming one or more lines of material running along sidewalls of the mandrels. The different materials can have different etch resistivities to be able to selectively etch one or more of the materials to create features and create cuts and blocks where specified. Etching using an etch mask positioned above or below this multi-line layer further defines a pattern that is transferred into an underlying layer. Having a mandrel of two or more layers of material enables one of those materials to be sacrificial such as when etching a spin-on reversal overcoat material that has filled-in open spaces, but leaves an overburden.

14 Claims, 7 Drawing Sheets

(56) References Cited

U.S. PATENT DOCUMENTS

| | | |
|---|---|---|
| 8,815,497 B2 | 8/2014 | Millward et al. |
| 9,153,458 B2 | 10/2015 | Light et al. |
| 9,240,329 B2 | 1/2016 | Devilliers |
| 9,437,447 B2 | 9/2016 | Devilliers |
| 2010/0144150 A1 | 6/2010 | Sills et al. |
| 2012/0015486 A1 | 1/2012 | Millward et al. |
| 2012/0282778 A1 | 11/2012 | Light et al. |
| 2012/0322269 A1 | 12/2012 | Sills et al. |
| 2013/0122686 A1* | 5/2013 | Chang ............... H01L 21/02639 438/429 |
| 2013/0302981 A1 | 11/2013 | Millward et al. |
| 2014/0051251 A1 | 2/2014 | Light et al. |
| 2014/0183665 A1* | 7/2014 | Li ....................... H01L 27/0629 257/412 |
| 2015/0243518 A1 | 8/2015 | Devilliers |
| 2015/0243519 A1 | 8/2015 | Devilliers |
| 2016/0365286 A1* | 12/2016 | Basker ............ H01L 21/823412 |

OTHER PUBLICATIONS

S. Wolf and R.N. Tauber, (Silicon Processing for the VLSI Era, vol. 1—Process Technology, Lattice Press, 1986)(pp. 423-435) (Year: 1986).*

International Search Report and Written Opinion dated Sep. 26, 2017 in PCT/US2017/027693, 7 pages.

* cited by examiner

US 10,460,938 B2

METHOD FOR PATTERNING A SUBSTRATE USING A LAYER WITH MULTIPLE MATERIALS

CROSS REFERENCE TO RELATED APPLICATIONS

The present application claims the benefit of U.S. Provisional Patent Application No. 62/322,603, filed on Apr. 14, 2016, entitled "Method for Patterning a Substrate Using a Layer with Multiple Materials," which is incorporated herein by reference in its entirety.

BACKGROUND OF THE INVENTION

This disclosure relates to substrate processing, and, more particularly, to techniques for patterning substrates including patterning semiconductor wafers.

Methods of shrinking line-widths in lithographic processes have historically involved using greater-NA optics (numerical aperture), shorter exposure wavelengths, or interfacial media other than air (e.g., water immersion). As the resolution of conventional lithographic processes has approached theoretical limits, manufacturers have started to turn to double-patterning (DP) methods to overcome optical limitations.

In material processing methodologies (such as photolithography), creating patterned layers comprises the application of a thin layer of radiation-sensitive material, such as photoresist, to an upper surface of a substrate. This radiation-sensitive material is transformed into a relief pattern which can be used as an etch mask to transfer a pattern into an underlying layer on a substrate. Patterning of the radiation-sensitive material generally involves exposure of actinic radiation through a reticle (and associated optics) onto the radiation-sensitive material using, for example, a photolithography system. This exposure can then be followed by the removal of irradiated regions of the radiation-sensitive material (as in the case of positive photoresist), or non-irradiated regions (as in the case of negative resist) using a developing solvent. This mask layer can comprise multiple sub-layers.

Conventional lithographic techniques for exposing a pattern of radiation or light onto a substrate have various challenges that limit a size of features exposed, and limit pitch or spacing between exposed features. One conventional technique to mitigate exposure limitations is that of using a double patterning approach to allow the patterning of smaller features at a smaller pitch than what is currently possible with conventional lithographic techniques.

SUMMARY

Semiconductor technologies are continually progressing to smaller feature sizes including feature sizes of 14 nanometers, 7 nm, 5 nm, and below. This continual reduction in sizes of features from which various elements are fabricated places ever-greater demands on techniques used to form the features. The concept of "pitch" can be used to describe the sizing of these features. Pitch is the distance between the two identical points in two adjacent repetitive features. Half-pitch then is half the distance between identical features of an array.

Pitch reduction techniques, often somewhat erroneously yet routinely termed "pitch multiplication" as exemplified by "pitch doubling" etc., can extend the capabilities of photolithography beyond feature size limitations (optical resolution limitations). That is, conventional multiplication of pitch (more accurately pitch reduction or multiplication of pitch density) by a certain factor involves reducing a target pitch by a specified factor. Double patterning techniques used with 193 nm immersion lithography are conventionally considered as one of the most promising techniques to pattern 22 nm nodes and smaller. Noteworthy is that self-aligned spacer double patterning (SADP) has already been established as a pitch density doubling process and has been adapted in high volume manufacturing of NAND flash memory devices. Moreover, ultra-fine resolution can be obtained to repeat the SADP step twice as pitch quadrupling.

Although there exist several patterning techniques to increase pattern density or pitch density, conventional patterning techniques suffer from poor resolution or rough surfaces of etched features. Thus, conventional techniques cannot provide a level of uniformity and fidelity desired for very small dimensions (20 nm and smaller). Reliable lithographic techniques can produce features having a pitch of about 80 nm. Conventional and emerging design specifications, however, desire to fabricate features having critical dimensions less than about 20 nm or 10 nm. Moreover, with pitch density doubling and quadrupling techniques, sub-resolution lines can be created, but making cuts or connections between these lines is challenging, especially since the pitch and dimensions needed for such cuts is far below capabilities of conventional photolithography systems.

Techniques disclosed herein provide a method for pitch reduction (increasing pitch/feature density) for creating high-resolution features and also for cutting on pitch of sub-resolution features. Techniques herein include forming a bi-layer or multi-layer mandrels and then forming one or more lines of material running along sidewalls of the mandrels. The different materials can have different etch characteristics to be able to selectively etch one or more of the materials to create features and create cuts and blocks where specified. The multiple materials can be a pattern of alternating, sub-resolution lines, and each line can be preferentially etched relative to the other lines. Etching using an etch mask positioned above or below this multi-line layer further defines a pattern that is transferred into an underlying layer. Having a mandrel of two or more layers of material enables one of those materials to be sacrificial such as when etching a spin-on reversal overcoat material that has filled in open spaces, but leaves an overburden. One or more etched lines, combined with an etch mask, provide a combined etch mask defining sub-resolution features. Thus, methods herein provide a sequence of materials that provide selective self-alignment, such as for blocking or cutting. Combined with an underlying transfer layer or memorization layer, many different etch resistivities can be selectively accessed for creating sub-resolution features.

One embodiment includes a method of patterning a substrate. Such a patterning method includes forming mandrels on a target layer of a substrate. The mandrels are comprised of at least two layers of material. The mandrels include a bottom layer comprised of a first material, and a top layer comprised of a second material. The target layer is comprised of a fifth material. Sidewall spacers are formed on sidewalls of the mandrels. The sidewall spacers are comprised of a third material. A fill material is deposited on the substrate that at least partially fills open spaces defined between the sidewall spacers. The fill material is comprised of a fourth material. The first material, the third material and the fourth material have different etch resistivities compared to each other for one or more particular etch chemistries. The second material and the fourth material have a same etch resistivity for at least one particular etch chemistry. An etch process is executed that etches uncovered portions of the fill material and that etches uncovered portions of the top layer of the mandrels.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques disclosed herein provide a method for pitch reduction (increasing pitch/feature density) for creating high-resolution features and also for cutting on pitch of sub-resolution features. Techniques herein include forming bi-layer or multi-layer mandrels and then forming one or more lines of material running along sidewalls of the mandrels. The different materials can have different etch characteristics or resistivities to be able to selectively etch one or more of the materials to create features and create cuts and blocks where specified. The multiple materials can be a pattern of alternating, sub-resolution lines, and each line can be preferentially etched relative to the other lines. Etching using an etch mask positioned above or below this multi-line layer further defines a pattern that is transferred into an underlying layer. Having a mandrel of two or more layers of material enables one of those materials to be sacrificial such as when etching a spin-on reversal overcoat material that has filled in open spaces, but leaves an overburden. One or more etched lines, combined with an etch mask, provide a combined etch mask defining sub-resolution features. Thus, methods herein provide a sequence of materials that enable selective self-alignment, such as for blocking or cutting. Combined with an underlying transfer layer or memorization layer, many different etch selectivities can be accessed for creating sub-resolution features.

Figure 3:
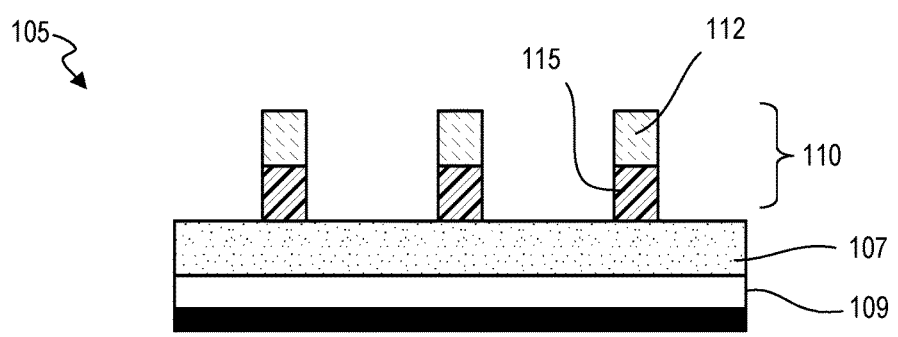

One embodiment includes a method of patterning a substrate. Mandrels are formed or provided on a target layer of a substrate. The mandrels are comprised of at least two layers of material with the mandrels including a bottom layer of a first material and a top layer of a second material. The target layer is comprised of a fifth material. FIG. 3 illustrates such multi-layer mandrels formed on a substrate. Mandrels 110 include bottom layer 115 and top layer 112. Mandrels 110 are positioned on a substrate 105 which can include target layer 107 and underlying layer 109. Note that other interfacial films, coatings, and layers can be included to assist with micro fabrication.

Figure 1:
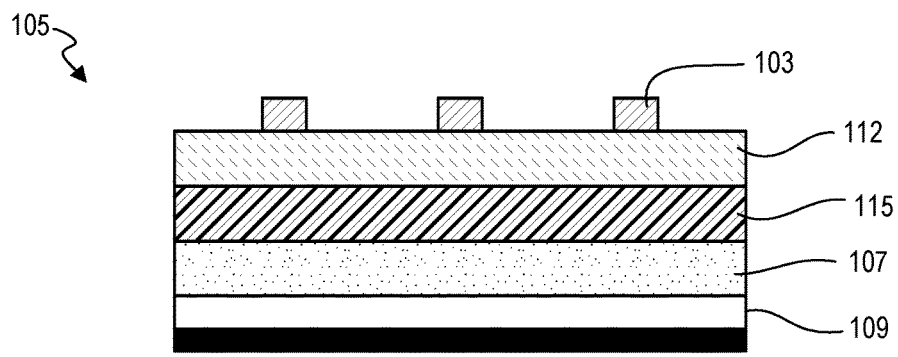
FIGS. 1-7 are cross-sectional schematic side views of an example substrate segment showing a process flow according to embodiments disclosed herein.
Figure 2:
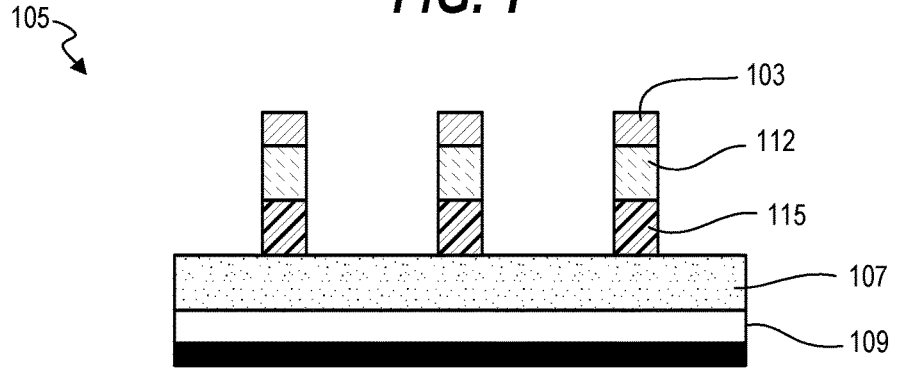

There are a few different ways of forming such multi-layer mandrels. Referring now to FIG. 1, bottom layer 115 can be deposited on substrate 105 using conventional deposition techniques such as spin-on deposition, physical vapor deposition, chemical vapor deposition, etc. After depositing bottom layer 115, top layer 112 can likewise be formed as a relatively planar and whole layer formed on top of bottom layer 115. With these two layers deposited, a relief pattern 103 can be formed on the substrate. Relief pattern 103 can be a photoresist that has been exposed via a photomask and developed. Note that other coatings or layers (not shown) such as antireflective coatings can be used to assist with development of the relief pattern 103. After the relief pattern 103 is formed, this relief pattern can be used as an etch mask to form mandrels 110. An anisotropic etch can be executed to remove material not covered by the relief pattern 103. Using a directional etch can result in forming (approximately) vertical sidewalls of the mandrels 110. Note that since top layer 112 and bottom layer 115 are different materials, different etch chemistries can be used to form the mandrels 110. FIG. 2 shows a result after a directional etch step. After forming the mandrels 110, relief pattern 103 can be removed. In some embodiments, the top layer (second material) is not an antireflective coating (ARC) film. In some conventional process flows, an antireflective coating, or other interfacial thin film, may be left on a masking layer when forming sidewall spacers. This ARC film, however, is typically thin compared to the actual patterning layers or memorization layers and not sufficiently thick for benefiting from planarization techniques herein. For example, such ARC films may have a thickness less than a curvature of top portions of sidewall spacers, and so planarizing the substrate to a top of the bottom layer would not provide the benefit of removing sidewall spacer rounding. Thus, the bottom layer and the top layer of the mandrels can be formed/deposited prior to any ARC deposition or other photolithography enabling films for creating an etch mask by photolithographic exposure. The top layer can be formed sufficiently thick to be thicker or taller than a top curvature or rounding of sidewall spacers that results from the spacer open etching process.

Figure 4:
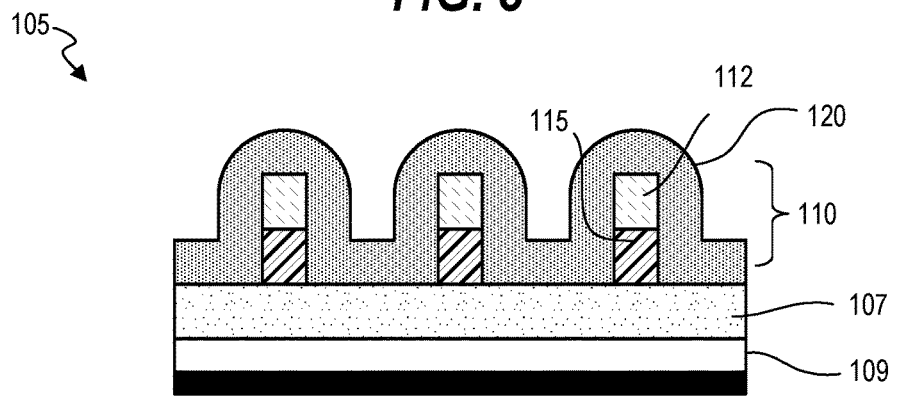
Figure 5:
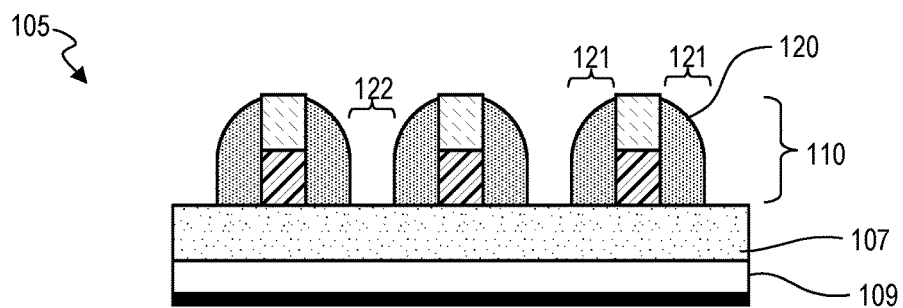

Referring now to FIG. 5, sidewall spacers 121 are formed on sidewalls of the mandrels. The sidewall spacers 121 are comprised of a third material. Sidewall spacers are generally lines of material that are formed to be in contact with sidewalls of the mandrels 110. Sidewall spacers can be formed by depositing a conformal film 120 on the substrate 105 as shown in FIG. 4. The conformal film 120 wraps around the mandrels 110 and provides a film having a relatively same thickness on both horizontal surfaces and vertical surfaces. A spacer etch process can be executed that directionally etches the conformal film 120 thereby removing the conformal film 120 from covering horizontal surfaces, except that horizontal surfaces under sidewall (vertical surface) depositions are protected. Thus open spaces 122 are defined between uncovered vertical surfaces of sidewall spacers 121. The result is sidewall spacers 121 which follow a shape of mandrels 110. Note that mandrels 110 can be lines of material that are straight lines, curved lines, routed lines with bends, etc. Mandrels 110 can also be mesas, cylinders, etc. As is known in the microfabrication industry, a mandrel it generally a vertically protruding structure around which other structures can be formed, and typically has a rectangular cross section, though sidewalls can have various amounts of slope depending on materials used and formation process.

Figure 6:
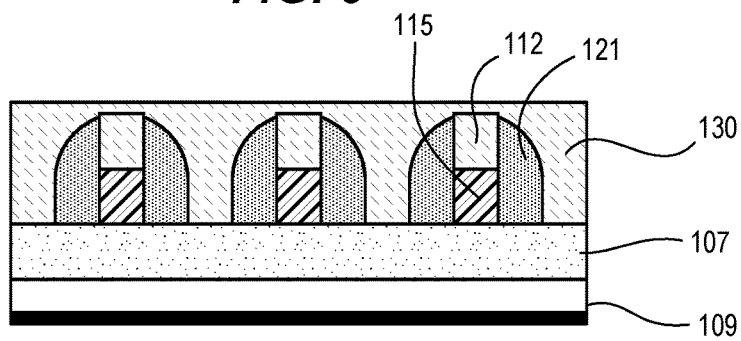

Referring now to FIG. 6, a fill material 130 is deposited on the substrate 105 that at least partially fills open spaces 122 defined between the sidewall spacers 121. The fill material 130 is comprised of a fourth material. Such fill material can be deposited by vapor deposition techniques or spin-on deposition techniques. Using spin-on deposition can be convenient for depositing such a fill material, but such deposition typically results as an overcoat deposition, leaving an overburden of material on the substrate 105. Note in FIG. 6 that the fill material 130 can cover the sidewall spacers 121 and the mandrels 110. The first material (bottom layer 115), the third material (sidewall spacers 121) and the fourth material (fill material 130) are all chemically different from each other in that each of these materials has a different etch resistivity. The second material and the fourth material, however, have a same etch resistivity for a given etch chemistry. For example, the second material and the fourth material can be identical, or have similar etch properties. By way of a non-limiting example, the second material can be amorphous carbon while the fourth material is spin-on carbon.

Figure 7:
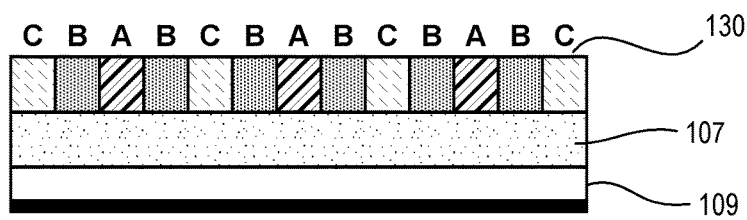
Figure 8:
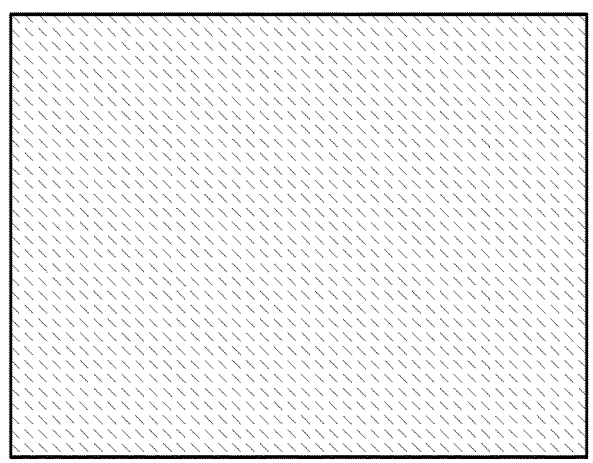
FIGS. 8-10 are a top views of an example substrate segment showing a process flow according to embodiments disclosed herein.

Underneath the overcoat of fill material 130, the substrate essentially now provides multiple lines of material of different etch resistivities. FIG. 7 is a horizontal cross section of substrate 105 showing substrate 105 as if all material above a top surface of bottom layer 115 has been removed. FIG. 7 is shown to illustrate that there are alternating lines of multiple materials. Note that in this particular example there is a repeating pattern of A-B-C-B-A-B-C-B. Sidewall spacers 121 have an even distribution and then areas between sidewall spacers 121 are occupied alternately by mandrels 110 and fill material 130. FIG. 8 shows a top view of the substrate 105 with fill material 130 having covered the substrate.

Figure 9:
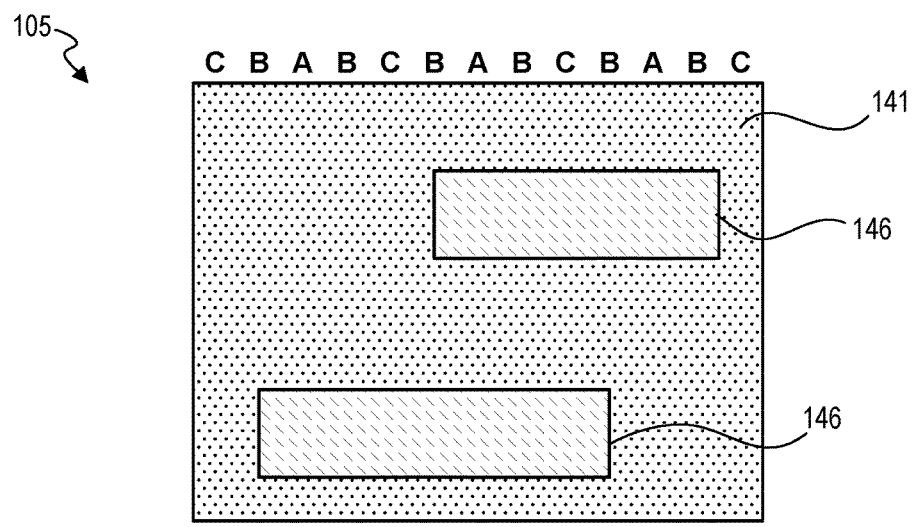
Figure 10:
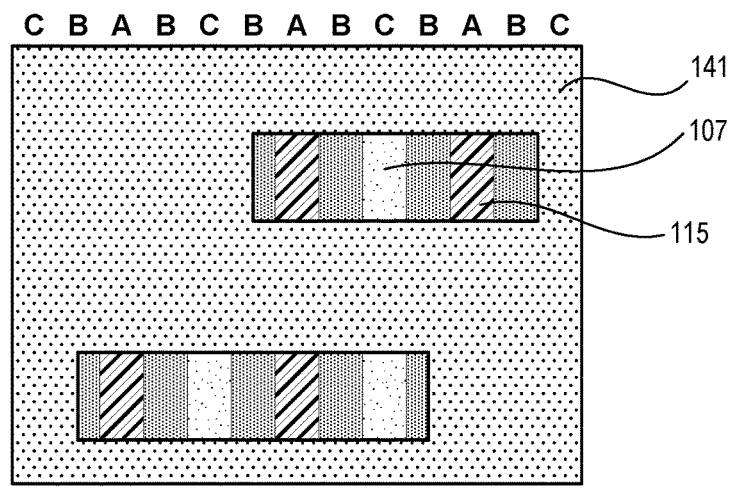
Figure 11:
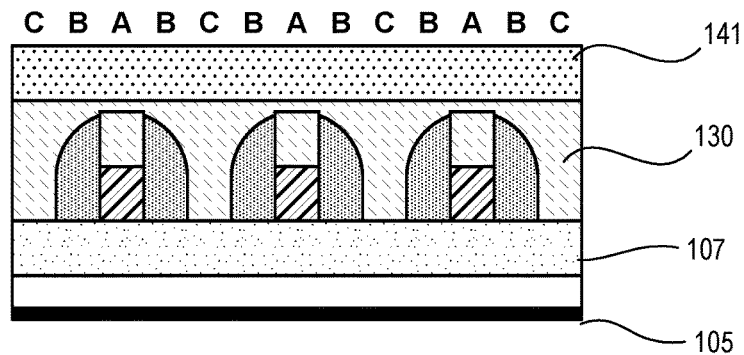
FIGS. 11 and 12 are cross-sectional schematic side views of an example substrate segment showing a process flow according to embodiments disclosed herein.

FIG. 9 is a top view of the substrate 105 with etch mask 141 having been formed on the substrate 105. Note that etch mask 141 defines opening 146 through which the substrate 105 is accessible to etchants. Referring now to FIGS. 10 and 11, an etch process is executed that etches uncovered portions of the fill material and that etches uncovered portions of the top layer of the mandrels. In this particular example, the uncovered portions are defined by the etch mask 141. A given etch chemistry selected etches fill material 130. Initially the overburden is removed, thereby uncovering sidewall spacers 121 and top layer 112. With sidewall spacers having a different etch resistivity, sidewall spacers resist being etched. Top layer 112, however, has a same etch resistivity as fill material 130 and thus is etched away with fill material 130. In some embodiments, at least a portion of the fill material and the top layer are simultaneously etched. A same etch chemistry can be used to etch the fourth material and the second material. The result is that bottom layer 115 of the mandrels 110 is now uncovered as well as target layer 107, both of which are visible through opening 146. FIG. 11 is a side view after this etch step illustrating that material of the substrate covered by etch mask 141 remain on the substrate 105.

Thus, in some embodiments, a relief pattern is formed on the substrate subsequent to depositing the fill material and prior to executing the etch process. The relief pattern defines openings that uncover portions of the substrate. The etch process then uses the relief pattern as an etch mask.

Figure 12:
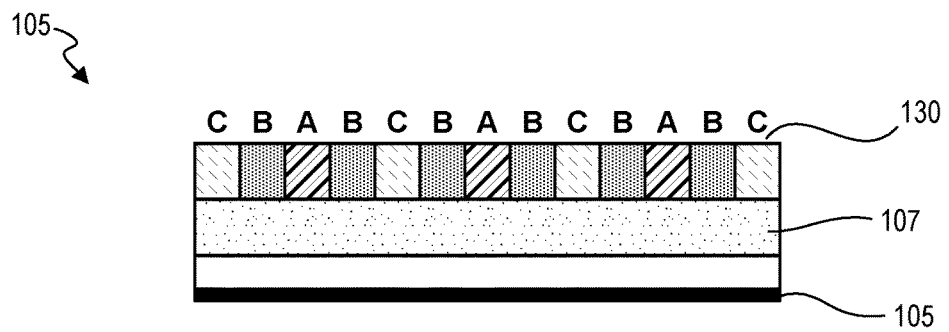
Figure 13:
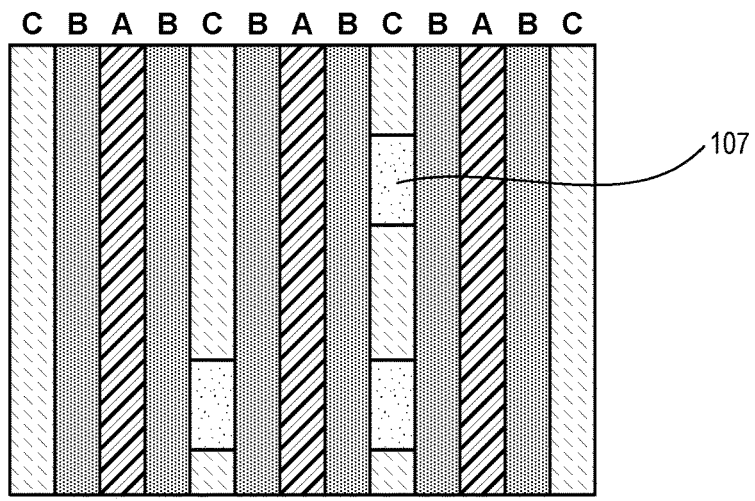
FIGS. 13-18 are a top views of an example substrate segment showing a process flow according to embodiments disclosed herein.

In some embodiments, a planarization process can be executed to benefit pattern transfer and etch mask formation. Subsequent to executing the etch process, a chemical-mechanical polishing (CMP) step can be executed that uses the bottom layer 115 of the mandrels 110 as a planarization stop material layer. The chemical-mechanical polishing step thus removes the third material above a top surface of the bottom layer of the mandrels. In other words, a top portion of the sidewall spacers can be sliced off along with the top 112 and the overburden and an upper portion of the fill material between sidewall spacers. A result is shown in FIG. 12. Note that such a planarization step can mitigate corner rounding of sidewall spacers as well as removing iso-dense biasing of the overburden, providing well-defined lines for further etching and patterning. FIG. 13 is a top layer showing the three lines of material after planarization, as well as portions of target layer 107 uncovered from the first etch process. Note that CMP techniques are known in the semiconductor manufacturing industry. The bottom layer 115 (first material) can be selected as a material that resists chemical-mechanical polishing, such as silicon nitride.

The planarization step can optionally be executed before any etch transfer step. Prior to executing the etch process a chemical-mechanical polishing step can be executed that uses the bottom layer of the mandrels as a planarization stop material layer. With this alternative, a multi-line layer is formed that is planar with each line of material uncovered or accessible to etchants. Thus, after forming an etch mask, any of the uncovered materials can be selectively etched.

Figure 14:
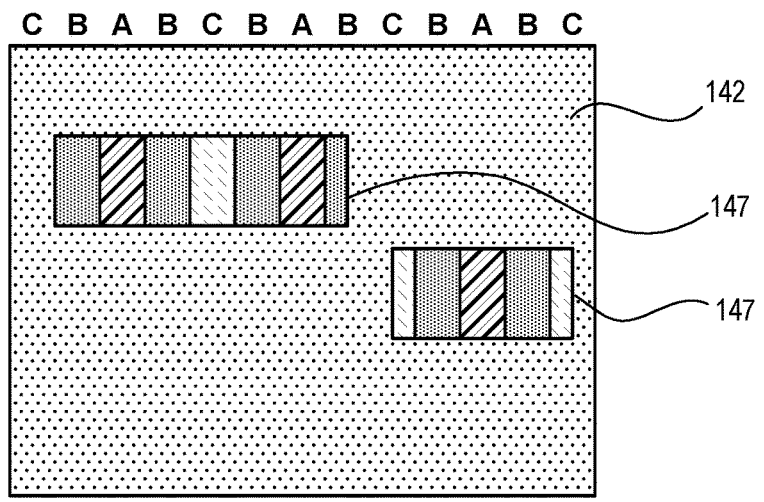
Figure 15:
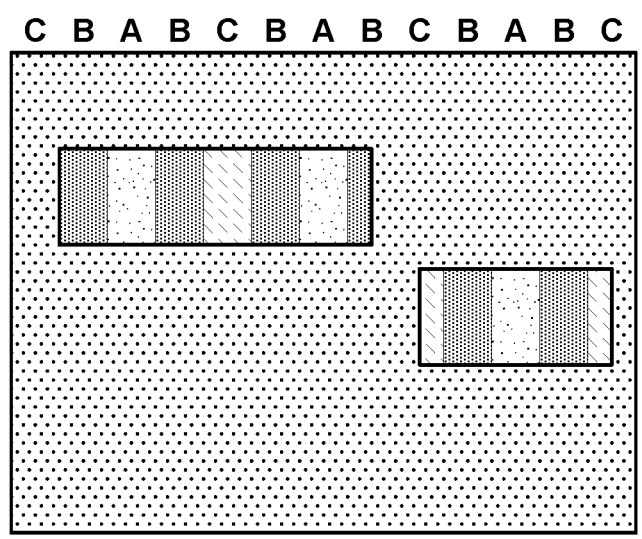
Figure 16:
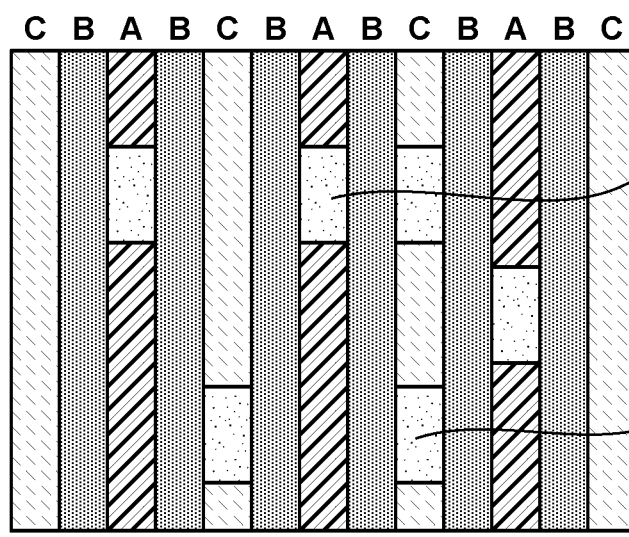
Figure 17:
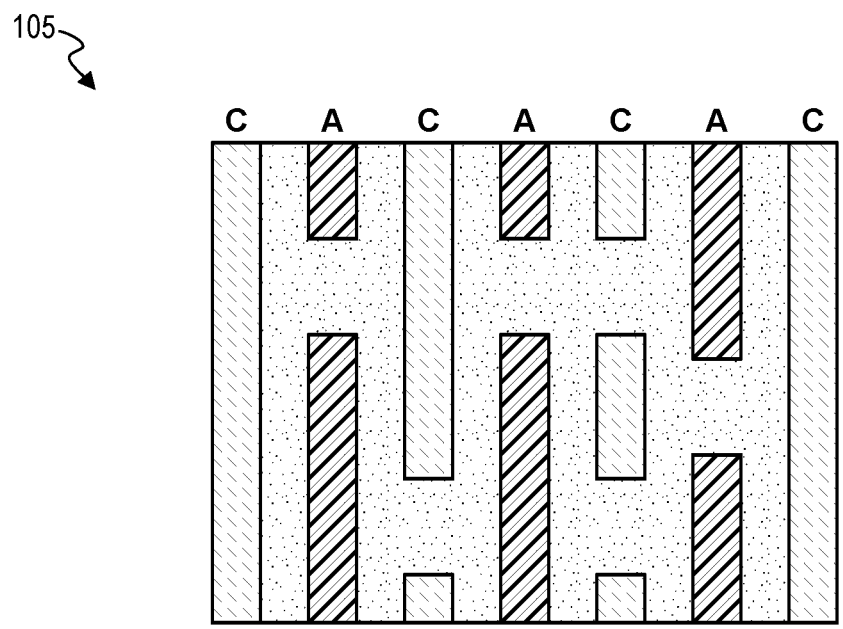
Figure 18:
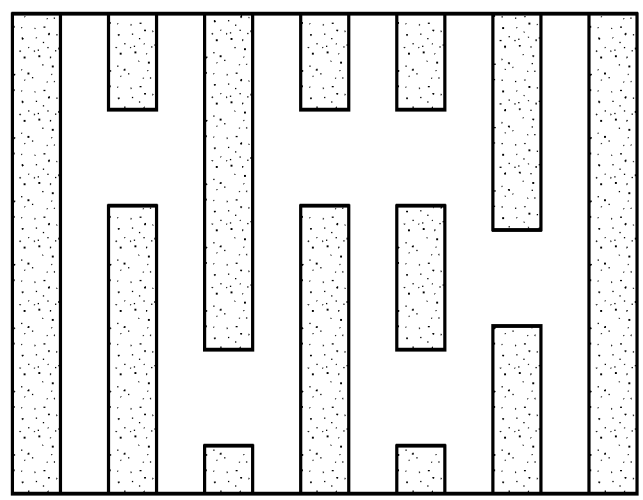

A second etch process can be executed that etches uncovered portions of the bottom layer of the mandrels using an second etch mask. FIG. 14 shows a top view of substrate 105 with etch mask 142 defining openings 147. In this example, the second etch process etches the first material (bottom layer 115). A result of the second etch step is depicted in FIG. 15 in which portions of target layer 107 are now visible. FIG. 16 is a top view after having removed etch mask 142. As can be appreciated, any number of patterning techniques can be continued. For example, the uncovered portions of target layer 107 can be contact openings to transfer into target layer 107. This can be executed in one or more processes. Target layer 107 can be used as a memorization layer. In another example patterning flow, all of the sidewall spacers 121 (third material or material B) can all be removed as shown in FIG. 17. Note that in FIG. 17, all of material B has been removed, as well as sections of material A and material C. Remaining portions of material A and material C can then be used as a combined etch mask to etch into target layer 107, and then subsequently the remaining material A and material C can be removed, such as by etching. An example result is shown in FIG. 18.

Figure 19:
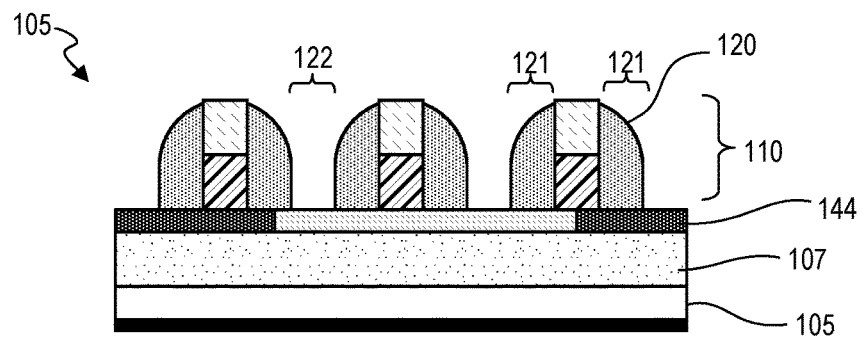
FIGS. 19-22 are cross-sectional schematic side views of an example substrate segment showing a process flow according to embodiments disclosed herein.

In other embodiments, a patterned hardmask layer 144 can be formed on the substrate 105 prior to forming the mandrels 110. As illustrated in FIG. 19, patterned hardmask layer 144 can be formed on top of target layer 107. In other embodiments, patterned hardmask layer 144 can be formed under target layer 107 or under another memorization layer. One benefit of forming the patterned hardmask layer 144 prior to forming the multi-line layer with the multi-layer mandrels, is that such a hardmask can be formed on a relatively planar layer. Forming a hardmask on top of the multi-line layer can involve first depositing a planarizing fill or otherwise mitigating iso-dense biasing.

Figure 20:
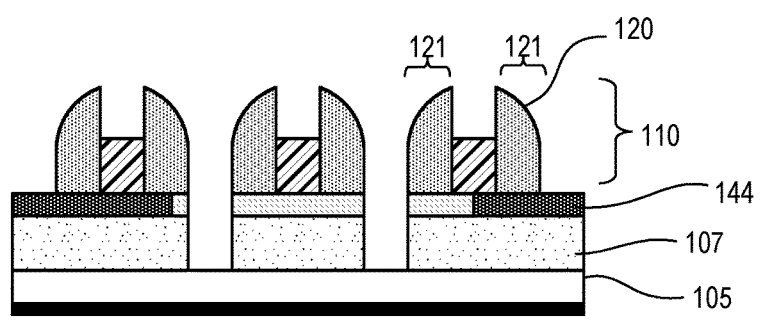
Figure 21:
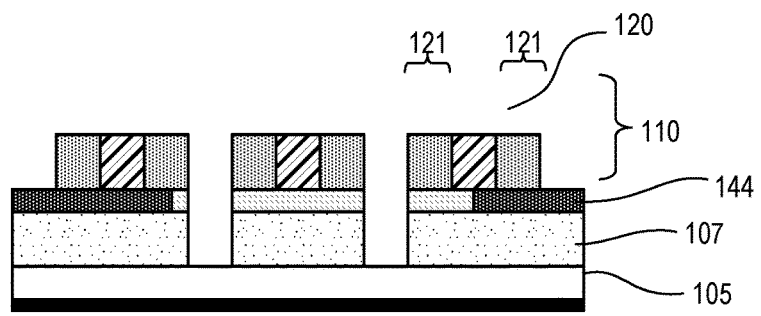
Figure 22:
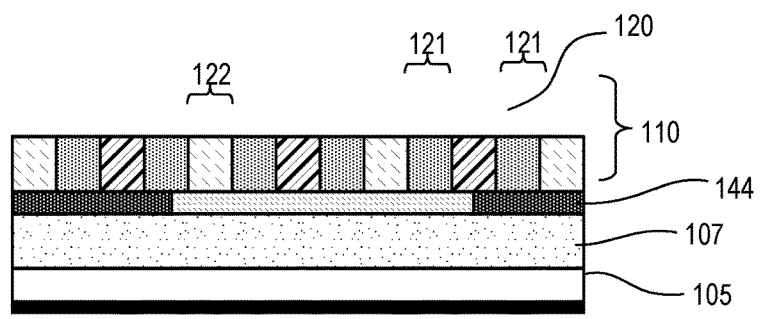

Executing a first etch process can then include transferring a combined pattern into the target layer 107. Such a combined pattern is defined by the sidewall spacers 121, the mandrels 110, and the patterned hardmask layer 144, with patterned hardmask layer 144 defining openings that span across two or more sidewall spacers. Accordingly pattern transfers can be self-aligned and can form sub-resolution features with the different materials of different etch resistivities further narrowing the patterned hardmask layer 144, or, rather, further narrowing what features are transferred into the target layer, memorization layer or underlying layers. Note that by forming the patterned hardmask layer 144 first, the fill material can be optional. Thus, open spaces between sidewall spacers can remain open because a hardmask has already been formed below. FIG. 20 shows an example result of using the multi-line layer and the patterned hardmask layer 144 underneath as a combined etch mask to etch into target layer 107. FIG. 21 shows a result of planarizing the substrate 105 after having executed a first etch step. Other embodiments can include depositing the filler material and planarizing the substrate as shown in FIG. 22. In FIG. 22 an etch mask is already in place below the multi-line layer, and the multi-line layer is now planar so that additional etch masks or patterning layers can be formed on top thereof.

In other embodiments, a second etch step can be executed that etches uncovered portions of the bottom layer of the mandrels. This can include transferring a second combined pattern into the target layer. The second combined pattern is defined by the sidewall spacers, the fill material, and the patterned hardmask layer. The patterned hardmask layer defines openings that span across two or more sidewall spacers. The patterned hardmask layer 144 can optionally include a planarizing fill material In another embodiment, forming the sidewall spacers includes forming first sidewall spacers on exposed sidewalls of the mandrels, and then forming second sidewall spacers, of a fifth material, on uncovered or exposed sidewalls of the first sidewall spacers. The second sidewall spacers have a different etch resistivity relative to the first sidewall spacers. The first material, the third material the fourth material, and the fifth material are all chemically different from each other by having different etch resistivities relative to each other.

In other embodiments, mandrels can have three or more layers. The mandrels can include a middle layer of a sixth material. The middle layer is positioned above the bottom layer and below the top layer. The sixth material can have a different etch resistivity relative to the first material and the second material. With three materials in the mandrels, the lowest material can be selected to be a same material as that of sidewall spacers formed on sidewall of the mandrels. With such a technique, any protruding footer on the mandrel can be etched away when sidewall spacers are selected to be etched.

An alternative embodiment includes a method of patterning a substrate by forming a multi-line layer above a target layer of a substrate. The multi-line layer includes a region having a pattern of alternating lines comprised of two or more lines having different etch resistivities. Each line of the pattern of alternating lines has a horizontal thickness, a vertical height, and extends across the target layer. Each line of the pattern of alternating lines is uncovered on a top surface of the multi-line layer and vertically extends to a bottom surface of the multi-line layer. At least one line of the two or more lines having different etch resistivities includes a multi-layer line having at least two materials of different etch resistivities including a bottom layer of a first material, and a top layer of a second material. The multi-line layer includes a line of a third material being positioned in contact with the multi-layer line on each side of the multi-layer line.

Another embodiment includes forming a patterned hardmask layer on a substrate. The patterned hardmask layer includes hardmask material that masks a portion of an underlying layer. The patterned hardmask layer includes a fill material that fills a remaining portion of the patterned hardmask layer. The fill material has a different etch resistivity relative to the hardmask material. Mandrels are formed on the patterned hardmask layer. The mandrels are comprised of at least two layers of material. The mandrels include a bottom layer of a first material, and a top layer of a second material. Sidewall spacers are formed on sidewalls of the mandrels. The sidewall spacers are comprised of a third material. The sidewall spacers define open spaces between exposed sidewalls of the sidewall spacers. An example is open spaces 122 of FIG. 19. An etch process is executed that transfers a combined pattern into the underlying layer. The combined pattern being defined by the hardmask material, the sidewall spacers and the bottom layer of the mandrels, the etch process removing the top layer of the mandrels. The fill material of the patterned hardmask layer can have a same etch resistivity as the top layer of the mandrels. The underlying layer can have a same etch resistivity as the top layer of the mandrels.

As can be appreciated, many patterning variations and fabrication processes can be executed using techniques herein. Having a multi-layer mandrel of two different materials, and sidewall spacers of a third material can enable multiple different etch selectivities as well as enabling a top portion of the multi-layer mandrel to be a sacrificial layer, or to have one line in the multi-line layer have multiple etch resistivities, which can be described conceptually as having multiple different colors.

Note that there are many different material selections enabled herein. One advantage of the multi-layer mandrel is that metal oxides are not needed for a spin-on fill material (reversal overcoat). For the bottom layer of the mandrels, example materials can include titanium oxide, hafnium oxide, low-temperature nitride, nitride, oxide, poly silicon, etc. For the top layer of the mandrels, material selections can include amorphous carbon, diamond-like carbon, spin-on carbon, spin-on glass, amorphous silicon, poly silicon, nitride, photoresist, etc. Spacer materials can include, but are not limited to, oxides, nitrides, titanium oxides, aluminum oxides, etc. Fill materials can include metal oxides, titanium oxide, tin oxide, zirconium oxide, hafnium oxide, titanium nanoparticle reversal agents, spin-on carbon, spin-on glass, or other conformal, mechanically stable materials. As can be appreciated, various materials can be selected for each line with care taken to select lines of differing etch resistivities. Accordingly, with techniques herein providing a self-aligned block, a given etch mask created at resolution of a given lithography system can be substantially larger than a desired pattern to transfer, but combined with multiple lines of material of different etch resistivities, sub resolution features can be created.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of patterning a substrate, the method comprising:
    forming mandrels on a target layer of a substrate, the mandrels being comprised of at least two layers of material, the mandrels including a bottom layer comprised of a first material, and a top layer comprised of a second material different than the first material, the target layer being comprised of a fifth material;
    forming sidewall spacers on sidewalls of the mandrels, the sidewall spacers comprised of a third material;
    depositing a fill material on the substrate that at least partially fills open spaces defined between the sidewall spacers, the fill material being comprised of a fourth material, wherein the first material, the third material and the fourth material have different etch resistivities compared to each other for one or more particular etch chemistries;
    forming a mask on the fill material, the mask defining one or more openings providing uncovered portions of the fill material;
    executing an etch process that (i) etches the one or more uncovered portions of the fill material to provide one or more uncovered portions of the top layer of the mandrels, and that (ii) etches the one or more uncovered portions of the top layer of the mandrels, and
    subsequent to executing the etch process, executing a chemical-mechanical polishing step that uses the bottom layer of the mandrels as a planarization stop material layer, the chemical-mechanical polishing step removing the third material above a top surface of the bottom layer of the mandrels; and
    etching the target layer using the bottom layer and the fill material as a combined etch mask.

2. The method of claim 1, further comprising, executing a second etch process that etches uncovered portions of the bottom layer of the mandrels using a second etch mask.

3. The method of claim 1, further comprising, forming a patterned hardmask layer on the substrate prior to forming the mandrels, prior to forming the sidewall spacers, and prior to depositing the fill material, the patterned hardmask layer defining an etch mask, the patterned hardmask layer positioned above the target layer.

4. The method of claim 3, wherein executing the etch process includes transferring a combined pattern into the target layer, the combined pattern defined by the sidewall spacers, the mandrels, and the patterned hardmask layer, the patterned hardmask layer defining openings that span across two or more sidewall spacers.

5. The method of claim 3, further comprising, executing a second etch process that etches uncovered portions of the bottom layer of the mandrels, wherein executing the second etch process includes transferring a second combined pattern into the target layer, the second combined pattern defined by the sidewall spacers, the fill material, and the patterned hardmask layer, the patterned hardmask layer defining openings that span across two or more sidewall spacers.

6. The method of claim 1, wherein depositing a fill material on the substrate includes depositing via spin-on deposition.

7. The method of claim 6, wherein the spin-on deposition results in an overburden of fourth material covering at least a portion of the sidewall spacers and the mandrels.

8. The method of claim 1, wherein the mandrels are formed by depositing the bottom layer on the substrate, depositing the top layer on the bottom layer, and anisotropically etching through the top layer and the bottom layer using a same etch mask pattern, wherein the top layer is not an antireflective coating film.

9. The method of claim 1, wherein at least a portion of the fill material and the top layer are simultaneously etched, and wherein a same etch chemistry is used to etch the fourth material and the second material.

10. The method of claim 1, wherein the first material, the third material and the fourth material are all chemically different from each other by exhibiting different etch resistivities relative to each other during the etch process.

11. The method of claim 10, wherein the first material, the third material the fourth material, and the fifth material are all chemically different from each other.

12. The method of claim 1, wherein forming the sidewall spacers includes forming first sidewall spacers on exposed sidewalls of the mandrels, and then forming second sidewall spacers on exposed sidewall of the first sidewall spacers.

13. The method of claim 1, wherein the mandrels include a middle layer of a sixth material, the middle layer positioned above the bottom layer and below the top layer.

14. A method of patterning a substrate, the method comprising:

forming a patterned hardmask layer on a substrate, the patterned hardmask layer including hardmask material that masks a portion of an underlying layer, the patterned hardmask layer including a fill material that fills a remaining portion of the patterned hardmask layer;

forming mandrels on the patterned hardmask layer, the mandrels being comprised of at least two layers of material, the mandrels including a bottom layer of a first material, and a top layer of a second material different than the first material;

forming sidewall spacers on sidewalls of the mandrels, the sidewall spacers comprised of a third material, the sidewall spacers defining open spaces between exposed sidewalls of the sidewall spacers;

executing an etch process that transfers a combined pattern into the underlying layer, the combined pattern being defined by the hardmask material, the sidewall spacers and the bottom layer of the mandrels, the etch process removing the top layer of the mandrels; and subsequent to executing the etch process, executing a chemical-mechanical polishing step that uses the bottom layer of the mandrels as a planarization stop material layer, the chemical-mechanical polishing step removing the third material above a top surface of the bottom layer of the mandrels.

* * * * *